(12) United States Patent
Wabiszewski

(10) Patent No.: US 10,483,450 B1
(45) Date of Patent: Nov. 19, 2019

(54) INTERNAL ELECTRIC CONVERTER

(71) Applicant: Cody Brian Wabiszewski, Butler, PA (US)

(72) Inventor: Cody Brian Wabiszewski, Butler, PA (US)

( * ) Notice: Subject to any disclaimer, the term of this patent is extended or adjusted under 35 U.S.C. 154(b) by 332 days.

(21) Appl. No.: 14/953,327

(22) Filed: Nov. 28, 2015

(51) Int. Cl.
*H01L 35/32* (2006.01)
*H01L 35/34* (2006.01)

(52) U.S. Cl.
CPC .......... *H01L 35/325* (2013.01); *H01L 35/34* (2013.01)

(58) Field of Classification Search
None
See application file for complete search history.

(56) References Cited

U.S. PATENT DOCUMENTS

| | | | |
|---|---|---|---|
| 6,396,191 B1 | 5/2002 | Hagelstein et al. | |
| 6,951,689 B1 * | 10/2005 | Higashikawa | .. H01L 31/022466 136/255 |
| 7,109,408 B2 | 9/2006 | Kucherov et al. | |
| 2016/0126381 A1 * | 5/2016 | Wang et al. | .... H01L 31/035227 257/429 |

OTHER PUBLICATIONS

Stafeev, VI Thermoelectric and Other Phenomena in Structures with Nonequilibrium Charge Carriers and Nonoparticles, Semiconductors, 2009, vol. 43, No. 10, pp. 1280-1287, Rus.
Kevin Pipe, Minority Carriers and Thermoelectric Effects in Biopolar Devices, 2006, Taylor & Francis Group, LLC.
Gadzhialiev M. M., et al. The Thermoelectric Power of a Semiconductor p-n Heterojunction. vol. 37, No. 11, 2003, Russia.
Yu. I. Ravich., et al., Thermoelectric Figure of Merit of a p-n Junction, Semiconductors, vol. 35, No. 10, 2001, pp. 1161-1165, Russia.

* cited by examiner

*Primary Examiner* — Shannon M Gardner

(57) ABSTRACT

A semiconductor cell that allows thermally excited electron hole pairs to be harnessed as usable energy. The material bandgap and dopant levels of various layers allows for voltage potential and current to be created. The energy production results in a lowered temperature in the cell. Energy is transferred back to the cell in the form of heat from the surroundings via convection or conduction. Cell layout is a n $n^{++}$-$p^{++}$ p configuration and a module has multiple cells.

21 Claims, 6 Drawing Sheets

| Material | Bandgap (eV) |
|---|---|
| $Mg_2Sn$ | 0.22 |
| $Mg_2Pb$ | .028-.1 |
| $Mg_2Bi_2$ | 0.1 |
| FeSi | 0.1 |
| CoO | 0.125 |
| NiS | 0.12 |
| Sn | 0.08 |
| PbS | 0.28-.41 |
| $Bi_2Te_3$ | .15-.21 |

| Material | Bandgap (eV) |
|---|---|
| PbTe | 0.32 |
| $Bi_2Se_3$ | 0.3 |
| $CrO_2$ | 0.21 |
| SnTe | 0.32 |
| HgCdTe | 0-1.5 |
| PbSe | 0.27 |
| InAs | 0.36 |
| InSb | 0.17 |
| Cd3As2 | 0.14 |

INTERNAL ELECTRIC CONVERTER

FIELD OF THE INVENTION

The present invention relates to a solid state thermoelectric device which makes possible electric power generation by thermally responsive charge carriers across a p-n junction.

BACKGROUND OF THE INVENTION

Harnessing energy using solid state electronics and semiconductors is primarily achieved currently using photovoltaic, thermoelectric, thermionic, thermophotovoltaic and piezoelectric devices. Energy production using macro-scale temperature differences has been successfully implemented for many applications using thermoelectric, thermionic and thermophotovoltaic devices.

The present invention harnesses energy from molecular-scale temperature and electronic gradients. Energy on the molecular level is found in vibrational, translational, rotational and electronic states. Generating electrical power from the variation in energy at the molecular level is a useful method to produce electricity for many applications. Several advantages over prior solid state devices include larger availability of energy sources and less expensive processing methods.

SUMMARY OF THE INVENTION

Described herein is the Internal Electric Converter which produces electrical energy from energy available at the molecular level. A P-N junction is formed using a narrow gap semiconductor material which allows for a large number of intrinsic carriers to be generated. The semiconducting material has higher doping concentration layers next to the junction, which creates a strong electric field in the space charge region of the P-N junction.

When a P-N junction is in thermal equilibrium the drift current equals the diffusion current. The electric field strength naturally goes to a value that makes the drift and diffusion current equal in thermal equilibrium. This balance is created when extrinsic charge carriers diffuse across the junction and leave charged fixed ions behind, thus creating an electric field. An electric field is created by the absence of the diffused charged particles, that then opposes the diffusion of the charged carriers. The electric field does not prevent all majority carriers from diffusing but balances the drift and diffusion current values.

Layers of semiconductor material in the device have different dopant concentrations. Layers away from the junction have lower dopant concentrations, which results in the P-type and N-type semiconductor material having a lower concentration of majority carriers and a higher concentration of minority carriers. The higher concentration of minority carriers are able to diffuse approximately one diffusion length toward the junction and can be swept across the junction as drift current, therefore increasing the net drift current. The barrier height, or strength of the electric field at the junction and the opposing diffusion current, is not significantly changed. An increase in drift current relative to diffusion current occurs and a voltage bias is created in the cell. When a large number cells are connected in series, parallel or series and parallel in a module, the voltage and current values achievable for the device are favorable for many electrical power applications.

A cell comprising: a first substrate with a first substrate first side and a first substrate second side, wherein the first substrate is electrically insulating and thermally conductive; a first electrical contact with a first electrical contact first side and a first electrical contact second side, wherein the first electrical contact first side is connected to the first substrate second side; a first n-type semiconductor layer with a first n-type dopant concentration and a first n-type semiconductor layer first side and a first n-type semiconductor layer second side, wherein the first n-type semiconductor layer first side is connected to the first electrical contact second side; a second n-type semiconductor layer with a second n-type dopant concentration and a second n-type semiconductor layer first side and a second n-type semiconductor layer second side, wherein the second n-type dopant concentration is higher than the first n-type dopant concentration and the second n-type semiconductor layer first side is connected to the first n-type semiconductor layer second side; a first p-type semiconductor layer with a first p-type dopant concentration and a first p-type semiconductor layer first side and a first p-type semiconductor layer second side, wherein the first p-type semiconductor layer first side is connected to the second n-type semiconductor layer second side; a second p-type semiconductor layer with a second p-type dopant concentration and a second p-type semiconductor layer first side and a second p-type semiconductor layer second side, wherein the first p-type dopant concentration is higher than the second p-type dopant concentration and the second p-type semiconductor layer first side is connected to the first p-type semiconductor layer second side; a second electrical contact with a second electrical contact first side and a second electrical contact second side, wherein the second electrical contact first side is connected to the second p-type semiconductor layer second side; a second substrate with a second substrate first side and a second substrate second side, wherein the second substrate is electrically insulating and thermally conductive and the second substrate first side is connected to the second electrical contact second side.

A module comprising: a first cell comprising; a negative output wire with a negative output wire first side; a first electrical contact with a first electrical contact first side and a first electrical contact second side and a first electrical contact third side, wherein the first electrical contact third side is connected to the negative output wire first side; a first n-type semiconductor layer with a first n-type dopant concentration and a first n-type semiconductor layer first side and a first n-type semiconductor layer second side, wherein the first n-type semiconductor layer first side is connected to the first electrical contact second side; a second n-type semiconductor layer with a second n-type dopant concentration and a second n-type semiconductor layer first side and a second n-type semiconductor layer second side, wherein the second n-type dopant concentration is higher than the first n-type dopant concentration and the second n-type semiconductor layer first side is connected to the first n-type semiconductor layer second side; a first p-type semiconductor layer with a first p-type dopant concentration and a first p-type semiconductor layer first side and a first p-type semiconductor layer second side, wherein the first p-type semiconductor layer first side is connected to the second n-type semiconductor layer second side; a second p-type semiconductor layer with a second p-type dopant concentration and a second p-type semiconductor layer first side and a second p-type semiconductor layer second side, wherein the first p-type dopant concentration is higher than the second p-type dopant concentration and the second p-type semiconductor layer first side is connected to the first p-type semiconductor layer second side; a first connecting wire with a first connecting wire first side and a first connecting wire second side; a second electrical contact with a second electrical contact first side and a second electrical contact second side and a second electrical contact third side, wherein the second electrical contact first side is connected to the second p-type semiconductor layer second side and the second electrical contact third side is connected to the first connecting wire first side; a second cell comprising; a third electrical contact with a third electrical contact first side and a third electrical contact second side and a third electrical contact third side, wherein the third electrical contact third side is connected to the first connecting wire second side; a third n-type semiconductor layer with a third n-type dopant concentration and a third n-type semiconductor layer first side and a third n-type semiconductor layer second side, wherein the third n-type semiconductor layer first side is connected to the third electrical contact second side; a fourth n-type semiconductor layer with a fourth n-type dopant concentration and a fourth n-type semiconductor layer first side and a fourth n-type semiconductor layer second side, wherein the fourth n-type dopant concentration is higher than the third n-type dopant concentration and the fourth n-type semiconductor layer first side is connected to the third n-type semiconductor layer second side; a third p-type semiconductor layer with a third p-type dopant concentration and a third p-type semiconductor layer first side and a third p-type semiconductor layer second side, wherein the third p-type semiconductor layer first side is connected to the fourth n-type semiconductor layer second side; a fourth p-type semiconductor layer with a fourth p-type dopant concentration and a fourth p-type semiconductor layer first side and a fourth p-type semiconductor layer second side, wherein the third p-type dopant concentration is higher than the fourth p-type dopant concentration and the fourth p-type semiconductor layer first side is connected to the third p-type semiconductor layer second side; a second connecting wire with a second connecting first side and a second connecting wire second side; a fourth electrical contact with a fourth electrical contact first side and a fourth electrical contact second side and a fourth electrical contact third side, wherein the fourth electrical contact first side is connected to the fourth p-type semiconductor layer second side and the fourth electrical contact third side is connected to the second connecting wire first side; a third cell comprising; a fifth electrical contact with a fifth electrical contact first side and a fifth electrical contact second side and a fifth electrical contact third side, wherein the fifth electrical contact third side is connected to the second electrical wire second side; a fifth n-type semiconductor layer with a fifth n-type dopant concentration and a fifth n-type semiconductor layer first side and a fifth n-type semiconductor layer second side, wherein the fifth n-type semiconductor layer first side is connected to the fifth electrical contact second side; a sixth n-type semiconductor layer with a sixth n-type dopant concentration and a sixth n-type semiconductor layer first side and a sixth n-type semiconductor layer second side, wherein the sixth n-type dopant concentration is higher than the fifth n-type dopant concentration and the sixth n-type semiconductor layer first side is connected to the fifth n-type semiconductor layer second side; a fifth p-type semiconductor layer with a fifth p-type dopant concentration and a fifth p-type semiconductor layer first side and a fifth p-type semiconductor layer second side, wherein the fifth p-type semiconductor layer first side is connected to the sixth n-type semiconductor layer second side; a sixth p-type semiconductor layer with a sixth p-type dopant concentration and a sixth p-type semiconductor layer first side and a sixth p-type semiconductor layer second side, wherein the fifth p-type dopant concentration is higher than the sixth p-type dopant concentration and the sixth p-type semiconductor layer first side is connected to the fifth p-type semiconductor layer second side; a positive output wire with a positive output wire first side; a sixth electrical contact with a sixth electrical contact first side and a sixth electrical contact second side and a sixth electrical contact third side, wherein the sixth electrical contact first side is connected to the sixth p-type semiconductor layer second side and the sixth electrical contact third side is connected to the positive output wire first side; a third substrate with a third substrate first side and a third substrate second side, wherein the third substrate is electrically insulating and thermally conductive and the third substrate second side is connected to the first electrical contact first side of the first cell, the third electrical contact first side of the second cell and the fifth electrical contact first side of the third cell; a fourth substrate with a fourth substrate first side and a fourth substrate second side, wherein the fourth substrate is electrically insulating and thermally conductive and the fourth substrate first side is connected to the second electrical contact second side of the first cell, the fourth electrical contact second side of the second cell and the sixth electrical contact second side of the third cell.

A method for creating a cell comprising: bonding a first electrical contact on first substrate; depositing a first n-type semiconductor layer on the first electrical contact, wherein the first n-type semiconductor layer has a first n-type dopant concentration; depositing a second n-type semiconductor layer on the first n-type semiconductor layer, wherein the second n-type semiconductor layer has a second n-type dopant concentration and the second n-type dopant concentration is higher than the first n-type dopant concentration; depositing a first p-type semiconductor layer on the first electrical contact, wherein the first p-type semiconductor layer has a first p-type dopant concentration; depositing a second p-type semiconductor layer on the first p-type semiconductor layer, wherein the second p-type semiconductor layer has a second p-type dopant concentration and the first n-type dopant concentration is higher than the second n-type dopant concentration; bonding a second electrical contact on the second p-type semiconductor layer; bonding a second substrate to the second p-type semiconductor layer.

BRIEF DESCRIPTION OF THE DRAWINGS

FIG. 9 depicts tables listing example semiconductor materials for the device.

DETAILED DESCRIPTION OF THE
PREFERRED EMBODIMENTS

The features of the present invention and the manner of attaining them will be described in greater detail with reference to the following descriptions, claims and drawings. Referenced numerals are reused, where appropriate, to indicate a correspondence between the referenced items.

Layout of Device

Figure 1:
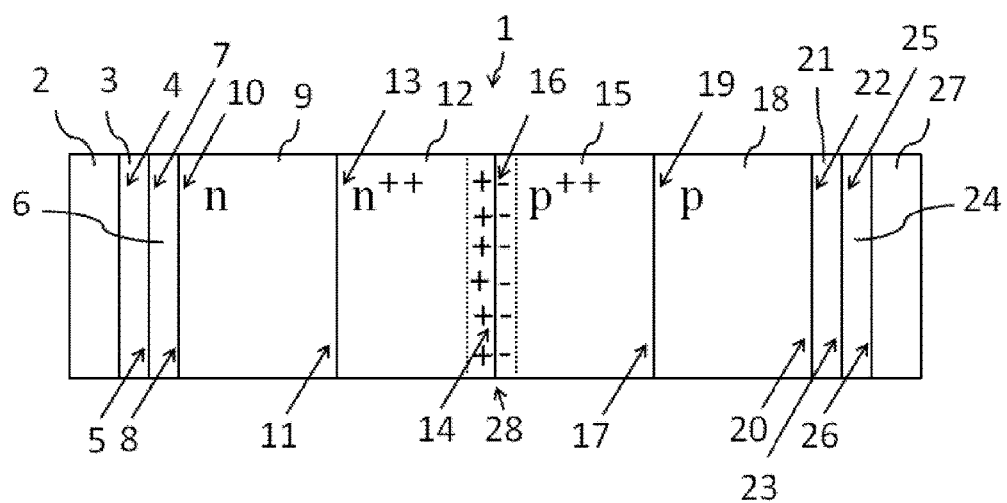
FIG. 1 depicts a sectional view and indicates the key layers of the cell.

An embodiment of the Internal Electric Converter is shown in FIG. 1. The overall semiconductor cell 1 illustrates components, layers and sides of the cell. Component 2 is the first heat exchanger. Component 3 is the first substrate. Side 4 is the first substrate first side. Side 5 is the first substrate second side. Component 6 is the first electrical contact. Side 7 is the first electrical contact first side. Side 8 is the first electrical contact second side. Layer 9 is the first n-type semiconductor layer. Side 10 is the first n-type semiconductor layer first side. Side 11 is the first n-type semiconductor layer second side. Layer 12 is the second n-type semiconductor layer, wherein the dopant concentration in the second n-type semiconductor layer 12 is higher than in the first n-type semiconductor layer 9. Side 13 is the second n-type semiconductor layer first side. Side 14 is the second n-type semiconductor layer second side. Layer 15 is the first p-type semiconductor layer. Side 16 is the first p-type semiconductor layer first side. Side 17 is the first p-type semiconductor layer second side. Layer 18 is the second p-type semiconductor layer, wherein the dopant concentration in the first p-type layer 15 is higher than in the second p-type semiconductor layer 18. Side 19 is the second p-type semiconductor layer first side. Side 20 is the second p-type semiconductor layer second side. Component 21 is the second electrical contact. Side 22 is the second electrical contacts first side. Side 23 is the second electrical contact second side. Component 24 is the second substrate. Side 25 is the second substrates first side. Side 26 is the second substrates second side. Component 27 is the second heat exchanger. Section 28 is the space charge region of the P-N junction where an electric field is present.

Figure 2:
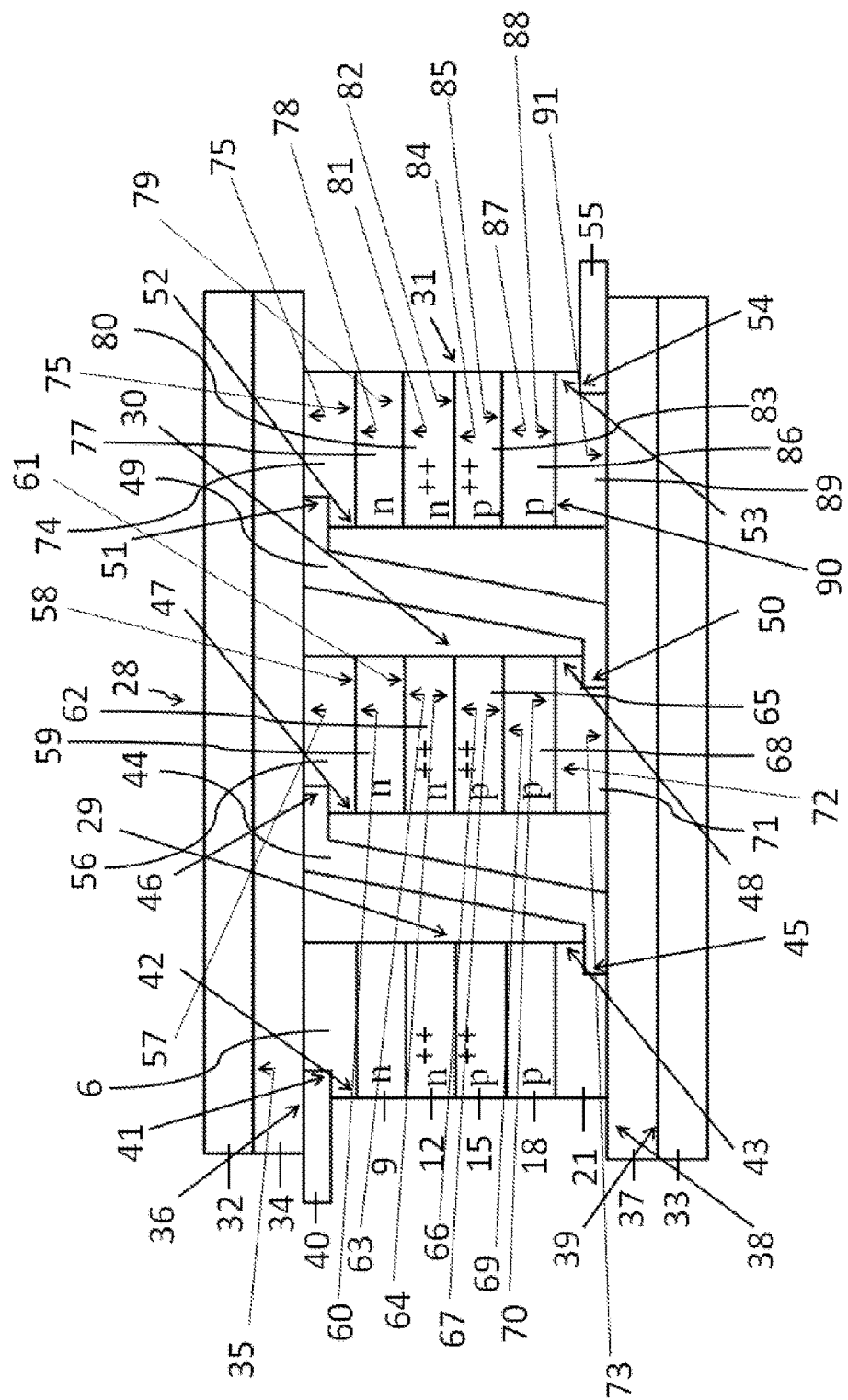
FIG. 2 depicts a sectional view of a module where the semiconductor cells connected in series.

Another embodiment of the Internal Electric Converter is shown in FIG. 2. The module 28 module illustrates how multiple cells can be connected in series. The components of the cells that are the same as in FIG. 1 are shown one more time in FIG. 2. The sides that are the same are not shown to allow clarity for new connections shown in FIG. 2. The heat exchangers and substrates are given new figure numbers because these now span over multiple cells. The new features of the device will be outlined. Cell 29 is in it the first cell. Cell 30 is the second cell. Cell 31 is the third cell. Component 32 is the third heat exchanger. Component 33 is the fourth heat exchanger. Component 34 is the third substrate. Side 35 is the first side of the third substrate. Side 36 is the second side of the third substrate. Component 32 is the third heat exchanger. Component 33 is the fourth heat exchanger. Component 37 is the fourth substrate. Side 38 is the first side of the fourth substrate. Side 39 is the second side of the fourth substrate. Component 40 is the negative output wire. Side 41 is the negative output wire first side. Side 42 is the first electrical contact third side of cell 29. Side 43 is the second electrical contact third side of cell 29. Component 37 is the first connecting wire. Side 45 is the first connecting wire first side. Side 46 is the first connecting wire second side. Side 47 is the third electrical contact third side of cell 30. Side 48 is the fourth electrical contact third side of cell 30. Component 49 is the second connecting wire. Side 50 is the second connecting wire first side. Side 51 is the second connecting wire second side. Side 52 is the fifth electrical contact third side of cell 31. Side 53 is the sixth electrical contact third side of cell 31. Side 54 is the positive output wire first side. Component 55 is the positive output wire. Component 65 is the third electrical contact. Side 57 is the third electrical contact first side. Side 58 is the third electrical contact second side. Layer 59 is the third n-type semiconductor layer. Side 60 is the third n-type semiconductor layer first side. Side 61 is the third n-type semiconductor layer second side. Layer 62 is the fourth n-type semiconductor layer, wherein the dopant concentration in the fourth n-type semiconductor layer 62 is higher than in the third n-type semiconductor layer 59. Side 63 is the fourth n-type semiconductor layer first side. Side 64 is the fourth n-type semiconductor layer second side. Layer 65 is the third p-type semiconductor layer. Side 66 is the third p-type semiconductor layer first side. Side 67 is the third p-type semiconductor layer second side. Layer 68 is the fourth p-type semiconductor layer, wherein the dopant concentration in the third p-type layer 65 is higher than in the fourth p-type semiconductor layer 68. Side 69 is the fourth p-type semiconductor layer first side. Side 70 is the fourth p-type semiconductor layer second side. Component 71 is the fourth electrical contact. Side 72 is the fourth electrical contacts first side. Side 73 is the fourth electrical contact second side. Component 74 is the fifth electrical contact. Side 75 is the fifth electrical contact first side. Side 76 is the fifth electrical contact second side. Layer 77 the fifth n-type semiconductor layer. Side 78 is the fifth n-type semiconductor layer first side. Side 79 is the fifth n-type semiconductor layer second side. Layer 80 is the sixth n-type semiconductor layer, wherein the dopant concentration in the sixth n-type semiconductor layer 80 is higher than in the fifth n-type semiconductor layer 77. Side 81 is the sixth n-type semiconductor layer first side. Side 82 is the sixth n-type semiconductor layer second side. Layer 83 is the fifth p-type semiconductor layer. Side 84 is the fifth p-type semiconductor layer first side. Side 85 is the fifth p-type semiconductor layer second side. Layer 86 is the sixth p-type semiconductor layer, wherein the dopant concentration in the fifth p-type layer 83 is higher than in the sixth p-type semiconductor layer 86. Side 87 is the sixth p-type semiconductor layer first side. Side 88 is the sixth p-type semiconductor layer second side. Component 89 is the sixth electrical contact. Side 90 is the sixth electrical contacts first side. Side 91 is the sixth electrical contact second side.

Figure 3:
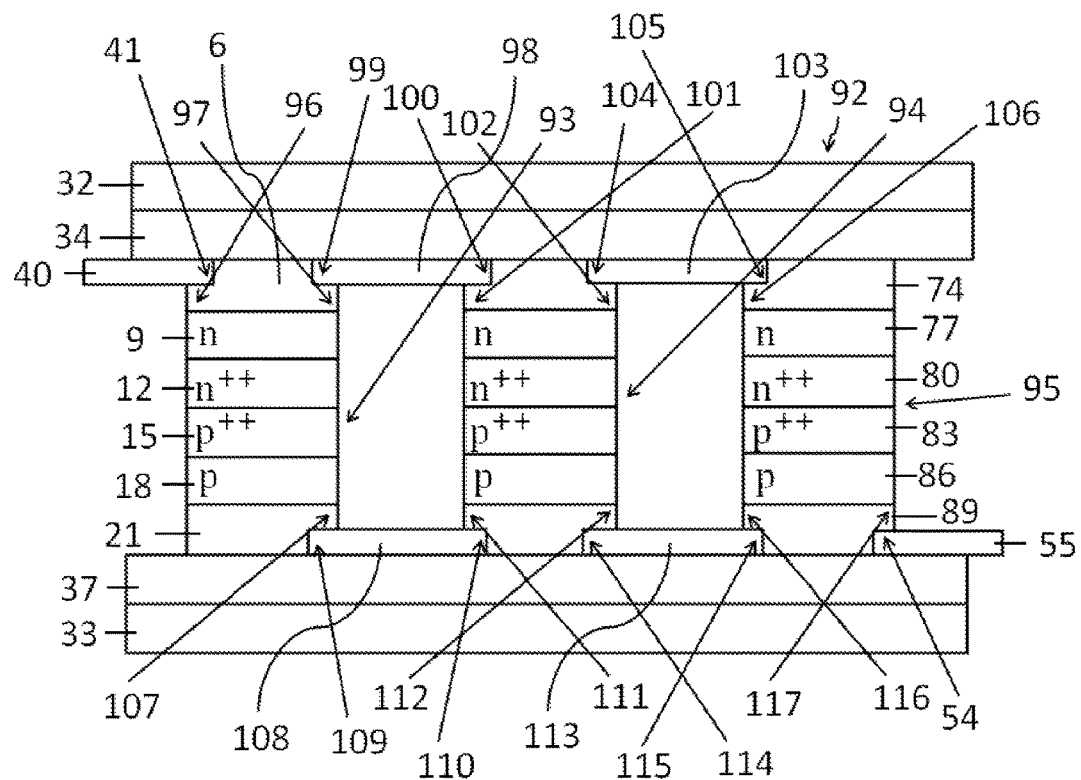
FIG. 3 depicts a sectional view of a module where the semiconductor cells connected in parallel.
Figure 4:
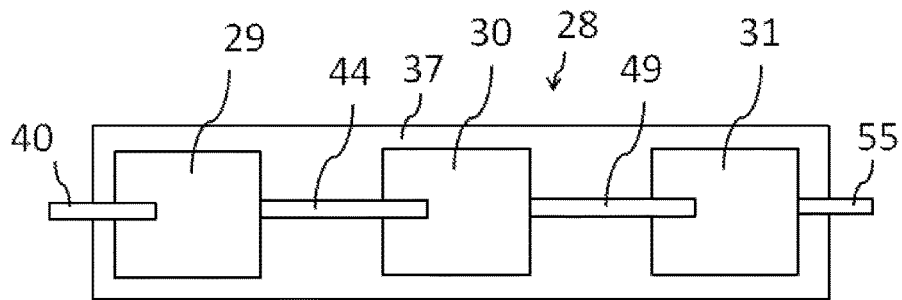
FIG. 4 depicts a sectional view of a module where the semiconductor cells connected in series.

Another embodiment of the Internal Electric Converter is shown in FIG. 3. The module 92 illustrates how multiple cells can be connected in parallel. Some of the components of the cells that are the same as in FIG. 1 or FIG. 2 are shown again in FIG. 3. The sides that are the same are not shown to allow clarity for new connections shown in FIG. 3. The heat exchangers and substrates are the same as in FIG. 2. The new features of the device will be outlined which are the electrical connections now in parallel. Cell 93 in it the first cell. Cell 94 is the second cell. Cell 95 is the third cell. Side 96 is the first electrical contact third side. Side 97 is the first electrical contact fourth side. Component 98 is the third connecting wire. Side 99 is the third connecting wire first side. Side 100 is the third connecting wire second side. Side 101 is the third electrical contact third side. Side 102 is the third electrical contact third side. Component 103 is the fifth connecting wire. Side 104 is the fifth connecting wire first side. Side 105 is the fifth connecting wire second side. Side 106 is the fifth electrical contact third side. Side 107 is the second electrical contact third side. Component 108 is the fourth connecting wire. Side 109 is the fourth connecting wire first side. Side 110 is the fourth connecting wire second side; Side 111 is the second electrical contact third side. Side 112 is the fourth electrical contact fourth side. Component 113 is the sixth connecting wire. Side 114 is the sixth connecting wire first side. Side 115 is the sixth connecting wire second side. Side 116 is the sixth electrical contact third side. Side 117 is the sixth electrical contact fourth side.

Charge Carrier Distributions

The carrier concentrations are described in terms of p-type and n-type dopant concentrations in semiconductor layers through the device. In FIG. 1 the n++ and p++ indicate increased doping relative to the other n-type and p-type layers. The n++ and p++ do not dictate a dopant concentration value. The higher dopant concentrations in the n-type layer 12 and p-type layer 15 creates a high level of majority carriers and low number of minority carriers. The lower dopant concentrations in the n-type layer 9 and p-type layer 18 results in a lower number of majority carriers and an increased number of minority carriers. The higher minority carrier concentrations in the n-type layer 9 and p-type layer 18 compared to the n-type layer 12 and p-type layer 18 respectfully, creates a carrier concentration gradient which results in an increase of diffusion of minority carriers toward the junction. The minority carriers are able to travel approximately one diffusion length toward the junction. Once the carriers reach the space charge region the carriers drift across. This results in the number of minority carriers at the junction edge being approximately equal to the equilibrium value of the highly doped layer 12 or layer 15 respectfully.

Figure 7:
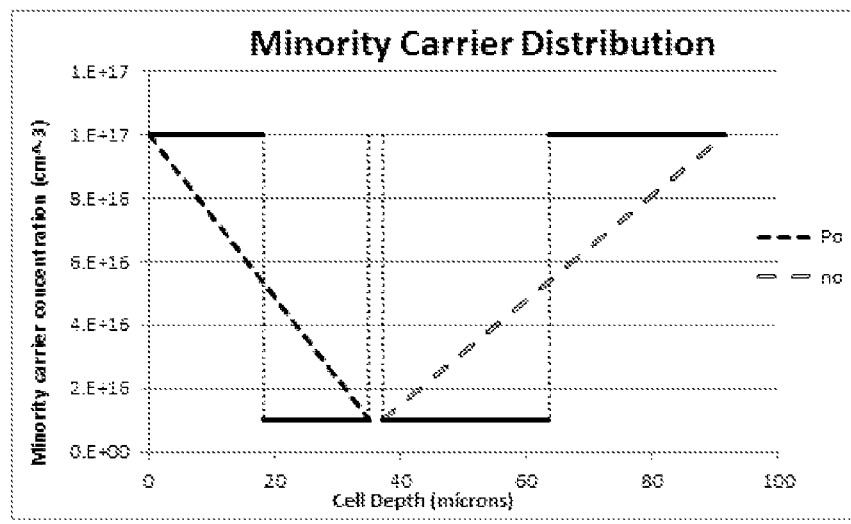
FIG. 7 depicts the minority carrier distribution across the semiconductor layers of the device.

The graph shown in FIG. 7 is intended to illustrate the general minority carrier distributions within the device. The solid lines represent the minority carrier concentrations within each layer if the layers were isolated. The dashed lines illustrate that the higher concentration of carriers will diffuse toward the junction. Once the minority carriers reach the edge of the depletion region all excess carriers drift across the junction. Therefore the carrier values at the junction equals that of the highly doped region. The actual distribution would not be linear but would likely have a concave down parabolic shape. The increase in minority carriers across the junction results in a buildup of majority carriers on both sides of the junction.

Assuming charge neutrality and using the law of mass action, the thermal equilibrium electron and hole carrier concentration are illustrated using the following equations. $N_d$ and $N_a$ are the concentration of donor and acceptor ions respectfully. $n_i$ is the number of intrinsic carriers. $n_o$ and $p_o$ are the electron and hole carrier concentrations. The thermal equilibrium hole carrier concentration is illustrated by the following equation.

Electron Carrier Concentration  Equation 1

$$n_o = \frac{N_d - N_a}{2} + \sqrt{\left(\frac{N_d - N_a}{2}\right)^2 + n_i^2}$$

Hole Carrier Concentration  Equation 2

$$p_o = \frac{N_a - N_d}{2} + \sqrt{\left(\frac{N_a - N_d}{2}\right)^2 + n_i^2}$$

The equations above can be used to find the equilibrium electron and hole carrier concentration within each layer of the device. The equations show that the number of minority carriers is a function of both the dopant concentration and the intrinsic carrier concentration. The minority carriers are present mostly due to thermal excitation within the crystalline semiconductor. The energy distribution within the semiconductor can be represented by the Fermi-Dirac Energy Distribution Function. This distribution shows that only a fraction of molecules within material have enough energy to excite carriers. The number of carriers excited also depends on the density of states for electrons in the conduction band and density of states for holes in the valance band. The carrier density can be calculated by integrating the product of the fermi distribution with the density of states with respect to energy.

Figure 8:
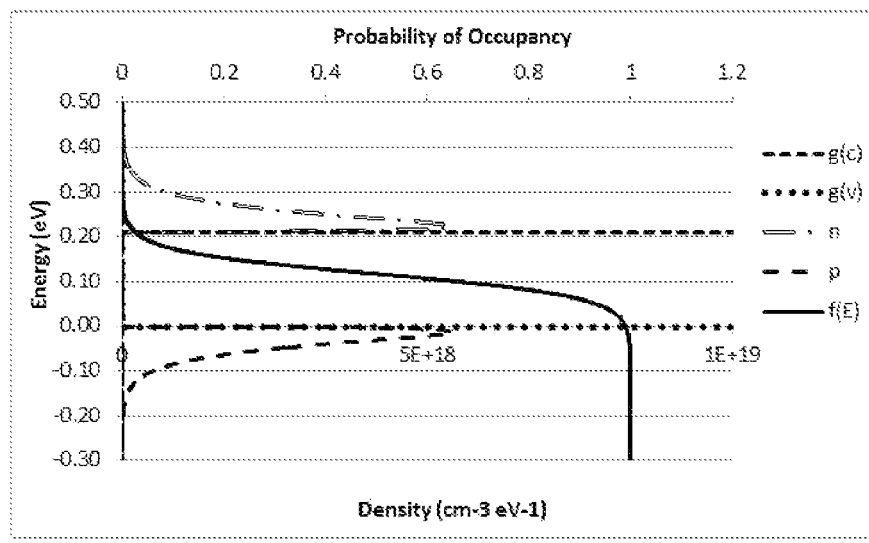
FIG. 8 depicts the density of carriers with respect to the Fermi-Dirac Distribution and the density of states.

A plotted example of these distributions is illustrated in FIG. 8 for an intrinsic semiconductor. F(e) is the Fermi-Dirac Energy Distribution Function; $g_{(c)}$ is the density of states for electrons in the conduction band; $g_{(v)}$ is the density of states for holes in the valance band; n is the carrier density of electrons and p is the carrier density for holes which are shown in FIG. 8.

Energy Band Diagrams

Figure 5:
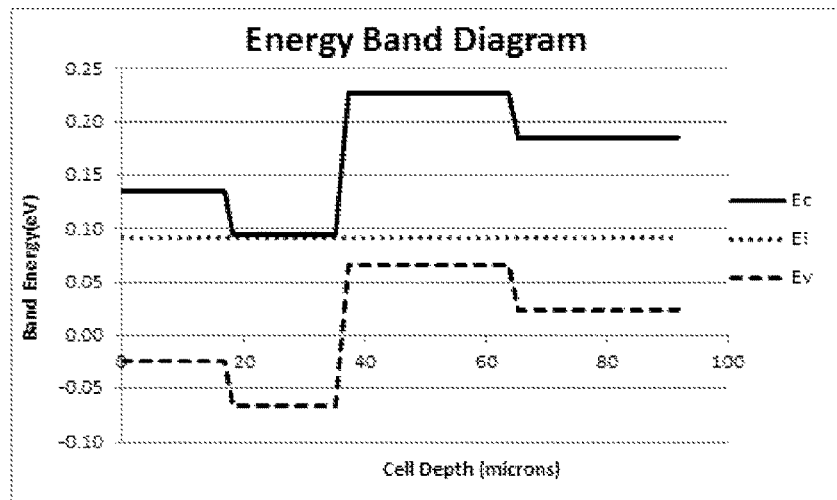
FIG. 5 depicts the energy band characteristics without a charge carrier bias.
Figure 6:
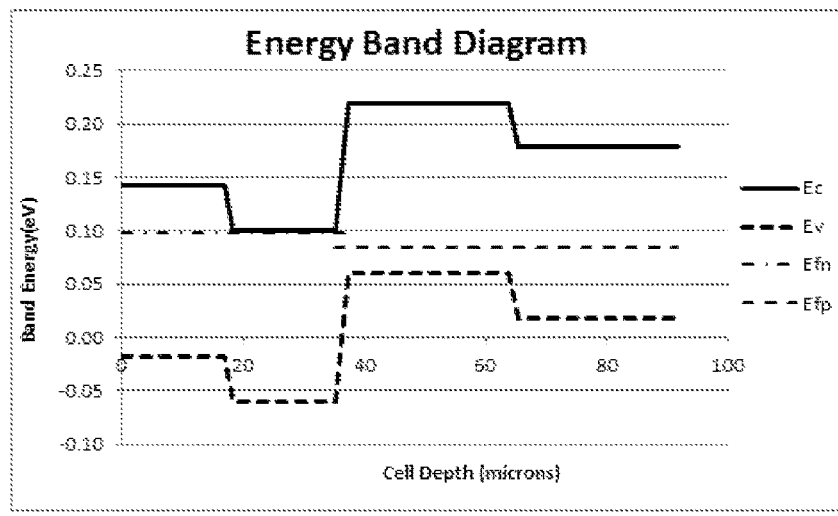
FIG. 6 depicts the energy band characteristics with a voltage bias.

The carrier concentration and distribution described above have a large influence on the energy levels of the conduction and valance bands, barrier heights and voltage created due to charge separation. The valance and conduction band energy levels are illustrated in FIG. 5 and FIG. 6. These figures show a general shape of band energy levels through the device. FIG. 5 shows the energy levels without a bias. FIG. 6 shows the energy levels with the bias caused from charge separation across the junction.

The conduction and valance band energy levels can be determined by using the two equations below. $E_c$ and $E_v$ are the conduction and valance band energy levels respectfully. T is average temperature. k is the Boltzmann constant. $E_f$ is the fermi level energy.

Conduction Band Energy Level  Equation 3

$$E_c = \ln\left(\frac{N_c}{n_0}\right)kT + E_f$$

Valance Band Energy Level  Equation 4

$$E_v = \ln\left(\frac{p_o}{N_v}\right)kT + E_f$$

The barrier height of the junction can be determined from equation 5 below. The barrier height needs to be high enough to stop a large saturation current from being created across the junction. The limiting barrier height for the device is based on the lower dopant levels in layer 9 and layer 18 which is shown in FIG. 1. Φ is the built in potential or barrier height. q is the charge of one carrier.

Built in potential  Equation 5

$$\phi = \frac{kT}{q}\ln\left[\frac{(N_A)(N_D)}{(n_i)^2}\right]$$

The higher concentration of minority carriers drifting across the junction creates an excess charge carrier concentration and is represented in the equation below by Δn. The excess charge carriers create a voltage bias that can be used for power generation. The equation below calculates the open circuit voltage. The dopant level used is based on the lower dopant levels in in layer 4 and layer 5 shown in FIG. 1. The doping level needs to be optimized to have a voltage and current level that creates the maximum amount of power.

Open Circuit Voltage                                  Equation 6

$$V_{OC} = \frac{kT}{q}\ln\left[\frac{((N_A)+(\Delta n))(\Delta n)}{(n_i)^2}\right]$$

When the drifting excess minority carriers cross the space charge region, they become excess majority carriers and create a forward bias. This voltage bias creates quasi-fermi levels. The barrier height of the junction needs to be sufficient to limit saturation current across the junction. The resistance in the circuit is low enough for the bias to cause the carriers to flow through the circuit from one material type to the other material type where the carriers recombine.
Current The diffusion of a higher concentration of minority carriers in the lighter doped sections traveling toward the lower concentration of minority carriers in a higher doped sections is an approximation for the max current. Other parasitic losses like resistance need to be taken into account. The diffusion equation for electrons and holes are shown below.

N-type Diffusion Current                              Equation 7

$$J_{n,diffusion} = qD_n\frac{dn}{dx}$$

P-type Diffusion Current                              Equation 8

$$J_{p,diffusion} = qD_p\frac{dp}{dx}$$

The variation in charge carriers dn and dp is the difference between the minority carriers within each material type due to the variation in doping. $D_n$ and $D_p$ are the diffusion coefficients for electrons and holes within the semiconductor material.
Semiconductor Material The semiconductor material used can be n-type and p-type. The semiconductor layers will have specific dopant concentrations. The sides of the semiconductor layers connect to other semiconductor layers or to the electrical contacts. Narrow bandgap materials which range from approximately 0.05-0.5 eV have potential to allow the device to generate substantial power. The abundance of a material, hazardous level, carrier mobility, diffusion length, ability to be doped with other common elements, cost of material and manufacturability are all factors to keep in mind when making a material selection. Lists of example semiconductor materials that could be used for the semiconductor layers are shown in the tables in FIG. 6. While not an exclusive list of potential materials, these are commonly used in semiconductor devices and address the characteristics listed above.

The thickness of the n-type and p-type semiconductor layers being at or below the diffusion length of the semiconductor material allows for significant carriers that are generated to be collected. The diffusion length will also vary depending on the lifetime and diffusion coefficient of the material. Different dopant concentrations can change the lifetime and diffusion coefficient values which can change the diffusion length in different layers of the same material type.

Advancement in manipulating the nanostructure of the semiconductor material could be used. Using two-dimensional atomic lattices could also give enhanced properties for example thermal and electrical conductivity.
Electrical Contacts The electrical contacts of the cells have multiple functions. The electrical contact sides are connected to the substrates and the semiconductor layers. To keep contact resistance low and ensure an ohmic contact between the electrical contact and semiconductor layer, a thin layer with increased doping, at the side of the semiconductor. At the side of the semiconductor, can be further described as a thickness from the semiconductor side that goes into the semiconductor layer that is sufficient for the dopant increase to change the band energy and allow an ohmic contact. The selected metal should have a work function that ensures the metal semiconductor junction barrier heights allow an ohmic contact with low resistance. The cells are electrically connected from cell to cell using connecting wire. A connecting wire could be a wire, a thin flat metal, or a section of extended electrical contacts. The first and last cell in a module can have a positive and negative output wire connected to the cells electrical contacts.

The device operates at a very high current and low voltage values, which makes extremely low resistance very important. Sources of resistance include; the movement of current through the electrical contacts, contact resistance at the metal semiconductor interface and the resistance of the top and rear metal contacts. Resistivity throughout the device may limit the potential power available and minimizing the overall device resistivity can increase power creation. Two-dimensional atomic lattice materials could help enhance the thermal and electrical conductivity, as well as decrease the resistance of the contacts.
Substrates The substrates function as the foundation for the cell. The substrates also function as electrical insulation between the electrical contacts and a heat sink or the surroundings. The substrates need to be thermally conductive to allow for heat transfer. Example materials would be ceramic substrates like Aluminum Nitride (AlN), Aluminum Oxide ($Al_2O_3$) or beryllium oxide (BeO). If the cell is operating in an environment that would not damage the components of the cell and transfers heat/energy to the cell without an electrically conductive interface, then the substrates could be omitted. An example of this would be energy transferred to the cell through convection of a nonreactive gas or energy transferred by means of radiation. The sides of the substrate are connected to the heat exchanger and the electrical contacts.
Heat Transfer The removal of energy from the device will result in a decrease in cell temperature. This will cause heat to transfer from the surroundings to the device. This heat transfer enables the continuous generation of thermal carriers. A heat exchanger should be sized according to the amount of heat required to be transferred across the device. A gas for example air could be used to transfer heat via convection to the substrate or electrical contacts. A direct fluid such as water could also be used as a heat exchanger. The gas and fluid could be stationary or flowing. Other heat exchangers like heat sinks or plate type heat exchangers can be used.

The decrease in cell temperature makes it so the cell or module can be used as a chiller, refrigerator or air conditioner. The heat exchanger interfacing with the surroundings will decrease the temperature of the surroundings.

Module Connections

To obtain desired voltage and current values for a module cells are electrically connected in series, parallel, or series and parallel. A module can contain a plurality of cells. Each cell will generally have the same properties and composition. The cells are electrically connected from electrical contact to electrical contact using connecting wires. A substrate can be connected to the top of all the cells in the module's electrical contacts. Another substrate can be connected to the bottom of all the cells in the module's electrical contacts. A top bottom heat exchanger can then be placed against the ceramic substrates of a module or multiple modules. Thermal paste can be used between the substrates and heat exchangers to increase thermal conductivity. A plurality of modules can also be electrically connected in series, parallel, or series and parallel to obtain the desired voltages. Modules can be stacked with the heat exchanger being placed on the top module and bottom module in order to be thermally connected in series or the modules can be placed side by side in order to be thermally connected in parallel. The cells in the modules are electrically connected in a circuit which allows for current to flow through the module and circuit. The cells are thermally connected in the module to allow for heat transfer through the module.

Once power is obtained from the cells or modules, the electrical power can be used indiscriminately for all power application. The module output wire can be connected to a power converter. The power converter can transform DC current to AC current and can also vary the current and voltage values. Using modules, a power converter and other typical power components, systems can be made to provide power for large scale energy needs or small enough for micro devices.

Method

The output wires and connecting wires can be connected using solder. Connecting wires could also be thin sheets of metal and be connected in a groove made in the electrical contacts. The electrical contacts can be bonded to the substrate using a direct bond method like high temperature oxidation or active metal brazing. The electrical contacts can be connected to the semiconductor via disposition techniques, directly bonded or using other bonding methods. Each semiconductor layer can be deposited via disposition techniques, melt techniques or other disposition methods. In each of these processes the concentration of each material and dopant levels would be controlled. The heat exchanger and ceramic substrates can be directly connected; thermal paste can be used between the substrates and heat exchangers to increase thermal conductivity.

A semiconducting sheet or wafer could be made by depositing semiconductor layers on a substrate with bottom electrical contacts bonded to the substrate. Through an etching process material would be removed to make individual cells. After the wafer was etched electrical contacts and a substrate could be applied to the top layers of the cells.

Dual Mode

The device top and bottom substrates could be made transparent and the metal contact could be a grid to allow ultra violet, visible and infrared radiation to generate power. The device would then generate power with thermally generated carriers and radiation generated carriers. The narrow band-gap of the semiconductor material would result in low efficiency for most of the solar radiation spectrum but in certain application could be beneficial. One benefit would be to establish an initial bias in the device.

EXAMPLE

This example is intended to be a basic model, with approximate values to quantitatively represent general principles of device operation. This example is not fully optimized. The materials, dimensions or values are not understood to be the values that will result in the largest power generation. The example is meant to show that by following established equations for materials with established properties, the claimed invention can generate significant electrical power.

Below is an example for $Bi_2Te_3$, bandgap 0.16 eV, $N_a=N_d=1e^{19}$ at an equilibrium temperature of 298K. In the first section the effective density of states and intrinsic values are calculated and will be used as values in many of the calculations. $m_e^*$ is the effective mass of electrons and $m_h^*$ is the effective mass of holes. Planck's constant is h. $E_g$ is the bandgap for the material.

Intrinsic Fermi Energy Level — Equation 9

$$E_i = \frac{E_C + E_V}{2} + \frac{3}{4}kT\ln\frac{m_h^*}{m_e^*} =$$

$$.08 \text{ eV} + \frac{3}{4}\left(.0000861\frac{\text{eV}}{\text{K}}\right)(298\text{k})\ln\left(\frac{.58}{1.07}\right) = .092 \text{ eV}$$

Effective Density of States of the Conduction Band — Equation 10

$$N_c = 2\left[\frac{2\pi m_e^* kT}{h^2}\right]^{\frac{3}{2}} =$$

$$2\left[\frac{2\pi(9.1094e^{-31}\text{ kg})(.58)\left(.0000861\frac{\text{eV}}{\text{K}}\right)(298\text{ k})}{(6.6261e^{-34}\text{ Js})^2}\right]^{\frac{3}{2}} =$$

$$1.097e^{19}\text{cm}^{-3}$$

Effective Density of States of The Valance Band — Equation 11

$$N_v = 2\left[\frac{2\pi m_e^* kT}{h^2}\right]^{\frac{3}{2}} =$$

$$2\left[\frac{2\pi(9.1094e^{-31}\text{ kg})(1.07)\left(.0000861\frac{\text{eV}}{\text{K}}\right)(298\text{ k})}{(6.6261e^{-34}\text{ Js})^2}\right]^{\frac{3}{2}} =$$

$$2.750e^{19}\text{cm}^{-3}$$

Intrinsic Carrier Concentration — Equation 12

$$n_i = \sqrt{N_c N_v}\, e^{\frac{E_g}{kT}} =$$

$$\sqrt{(1.091e^{18}\text{ cm}^{-3})(2.750e^{19}\text{ cm}^{-3})}\, e^{\frac{.16\text{ eV}}{(.0000861\frac{\text{eV}}{K})(298k)}} =$$

$$7.686e^{17}\text{cm}^{-3}$$

First N-Type Semiconductor Layer

Below are the values calculated for the first n-type semiconductor layer. $E_f$ is the fermi energy of the material. This first n-type semiconductor layer has a lower majority carrier concentration and a higher minority carrier concentration than the second n-type semiconductor material. Determining the minority concentration in each section allows for the concentration gradient to be calculated, which will help determine current and the amount of excess charge carriers that cross the space charge region.

Electron Carrier Concentration — Equation 13

$$n_o = \frac{N_d - N_a}{2} + \sqrt{\left(\frac{N_d - N_a}{2}\right)^2 + n_i^2} =$$

$$\frac{2.0e^{18}\text{ cm}^{-3}}{2} + \sqrt{\left(\frac{2.0e^{18}\text{ cm}^{-3}}{2}\right)^2 + 7.686e^{17}\text{ cm}^{-3\,2}} =$$

$$2.2616e^{18}\text{ cm}^{-3}$$

Hole Carrier Concentration    Equation 14

$$p_o = \frac{N_a - N_d}{2} + \sqrt{\left(\frac{N_a - N_d}{2}\right)^2 + n_i^2} = \frac{-2.0e^{18} \text{ cm}^{-3}}{2} +$$
$$\sqrt{\left(\frac{-1.0e^{18} \text{ cm}^{-3}}{2}\right)^2 + 7.686e^{17} \text{ cm}^{-32}} =$$
$$2.613e^{17} \text{ cm}^{-3}$$

Conduction Band Energy Level    Equation 15

$$E_c = \ln\left(\frac{N_c}{n_o}\right)kT + E_f =$$
$$\ln\left(\frac{1.097e^{19} \text{ cm}^{-3}}{2.2616e^{18} \text{ cm}^{-3}}\right)\left(.0000861 \frac{\text{eV}}{\text{K}}\right)(298 \text{ k}) + .08 \text{ eV} =$$
$$.132 \text{ eV}$$

Valance Band Energy Level    Equation 16

$$E_v = \ln\left(\frac{p_o}{N_v}\right)kT + E_f =$$
$$\ln\left(\frac{2.613e^{17} \text{ cm}^{-3}}{2.750e^{19} \text{ cm}^{-3}}\right)\left(.0000861 \frac{\text{eV}}{\text{K}}\right)(298 \text{ k}) + .08 \text{ eV} =$$
$$-.0277 \text{ eV}$$

Second N-Type Semiconductor Layer (n$^{++}$)

Below are the values for the second n-type semiconductor region. This second n-type semiconductor layer has a higher majority carrier concentration and a lower minority carrier concentration than the first n-type semiconductor material.

Electron Carrier Concentration    Equation 17

$$n_o = \frac{N_d - N_a}{2} + \sqrt{\left(\frac{N_d - N_a}{2}\right)^2 + n_i^2} =$$
$$\frac{1.0e^{19} \text{ cm}^{-3}}{2} + \sqrt{\left(\frac{1.0e^{19} \text{ cm}^{-3}}{2}\right)^2 + 7.686e^{17} \text{ cm}^{-32}} =$$
$$1.006e^{19} \text{ cm}^{-3}$$

Hole Carrier Concentration    Equation 18

$$p_o = \frac{N_a - N_d}{2} + \sqrt{\left(\frac{N_a - N_d}{2}\right)^2 + n_i^2} = \frac{-1.0e^{19} \text{ cm}^{-3}}{2} +$$
$$\sqrt{\left(\frac{-1.0e^{19} \text{ cm}^{-3}}{2}\right)^2 + 7.686e^{17} \text{ cm}^{-32}} =$$
$$5.873e^{16} \text{ cm}^{-3}$$

Conduction Band Energy Level    Equation 19

$$E_c = \ln\left(\frac{N_c}{n_o}\right)kT + E_f =$$
$$\ln\left(\frac{1.097e^{19} \text{ cm}^{-3}}{1.006e^{19} \text{ cm}^{-3}}\right)\left(.0000861 \frac{\text{eV}}{\text{K}}\right)(298 \text{ k}) + .08 \text{ eV} =$$
$$.094 \text{ eV}$$

Valance Band Energy Level    Equation 20

$$E_v = \ln\left(\frac{p_o}{N_v}\right)kT + E_f =$$
$$\ln\left(\frac{5.873e^{16} \text{ cm}^{-3}}{2.750e^{19} \text{ cm}^{-3}}\right)\left(.0000861 \frac{\text{eV}}{\text{K}}\right)(298 \text{ k}) + .08 \text{ eV} =$$
$$-.0660 \text{ eV}$$

First P-Type Semiconductor Layer (p$^{++}$)

Below are the values for the first p-type semiconductor region. This first p-type semiconductor layer has a higher majority carrier concentration and a lower minority carrier concentration than the second p-type semiconductor material.

Electron Carrier Concentration    Equation 21

$$n_o = \frac{N_d - N_a}{2} + \sqrt{\left(\frac{N_d - N_a}{2}\right)^2 + n_i^2} = \frac{-1.0e^{19} \text{ cm}^{-3}}{2} +$$
$$\sqrt{\left(\frac{-1.0e^{19} \text{ cm}^{-3}}{2}\right)^2 + 7.686e^{17} \text{ cm}^{-32}} =$$
$$5.873e^{16} \text{ cm}^{-3}$$

Hole Carrier Concentration    Equation 22

$$p_o = \frac{N_a - N_d}{2} + \sqrt{\left(\frac{N_a - N_d}{2}\right)^2 + n_i^2} =$$
$$\frac{1.0e^{19} \text{ cm}^{-3}}{2} + \sqrt{\left(\frac{1.0e^{19} \text{ cm}^{-3}}{2}\right)^2 + 27.686e^{17} \text{ cm}^{-32}} =$$
$$1.006e^{19} \text{ cm}^{-3}$$

Conduction Band Energy Level    Equation 23

$$E_c = \ln\left(\frac{N_c}{n_o}\right)kT + E_f =$$
$$\ln\left(\frac{1.097e^{19} \text{ cm}^{-3}}{5.873e^{16} \text{ cm}^{-3}}\right)\left(.0000861 \frac{\text{eV}}{\text{K}}\right)(298 \text{ k}) + .08 \text{ eV} =$$
$$.23 \text{ eV}$$

Valance Band Energy Level    Equation 24

$$E_v = \ln\left(\frac{p_o}{N_v}\right)kT + E_f =$$
$$\ln\left(\frac{1.006e^{19} \text{ cm}^{-3}}{2.750e^{19} \text{ cm}^{-3}}\right)\left(.0000861 \frac{\text{eV}}{\text{K}}\right)(298 \text{ k}) + .08 \text{ eV} =$$
$$.07 \text{ eV}$$

Second P-Type Semiconductor Layer

Below are the values for the second p-type semiconductor region. This second p-type semiconductor layer has a lower majority carrier concentration and a higher minority carrier concentration than the first n-type semiconductor material.

Electron Carrier Concentration    Equation 25

$$n_o = \frac{N_d - N_a}{2} + \sqrt{\left(\frac{N_d - N_a}{2}\right)^2 + n_i^2} = \frac{-2.0e^{18} \text{ cm}^{-3}}{2} +$$
$$\sqrt{\left(\frac{-1.0e^{18} \text{ cm}^{-3}}{2}\right)^2 + 7.686e^{17} \text{ cm}^{-32}} =$$
$$2.613e^{17} \text{ cm}^{-3}$$

Hole Carrier Concentration    Equation 26

$$p_o = \frac{N_a - N_d}{2} + \sqrt{\left(\frac{N_a - N_d}{2}\right)^2 + n_i^2} =$$
$$\frac{1.0e^{19} \text{ cm}^{-3}}{2} + \sqrt{\left(\frac{1.0e^{19} \text{ cm}^{-3}}{2}\right)^2 + 27.686e^{17} \text{ cm}^{-32}} =$$
$$2.261e^{18} \text{ cm}^{-3}$$

Conduction Band Energy Level    Equation 27

$$E_c = \ln\left(\frac{N_c}{n_o}\right)kT + E_f =$$
$$\ln\left(\frac{1.097e^{19} \text{ cm}^{-3}}{2.613e^{17} \text{ cm}^{-3}}\right)\left(.0000861 \frac{\text{eV}}{\text{K}}\right)(298 \text{ k}) + .08 \text{ eV} =$$
$$.19 \text{ eV}$$

-continued

Valance Band Energy Level  Equation 28

$$E_v = \ln\left(\frac{P_o}{N_v}\right)kT + E_f =$$

$$\ln\left(\frac{2.261e^{18} \text{ cm}^{-3}}{2.750e^{19} \text{ cm}^{-3}}\right)\left(.0000861\frac{\text{eV}}{\text{K}}\right)(298 \text{ k}) + .08 \text{ eV} =$$

$$.03 \text{ eV}$$

Values for P-N Device

The values calculated below are for the p-n junction. The depletion width thickness equation is shown below. ε is the relative permittivity. $\Phi_{bi}$ is the barrier height of the junction. The thickness of the second n-type semiconductor layer and first p-type semiconductor layer should be approximately greater than or equal to the depletion width thickness. This thickness allows for an electric field to be established in the space charge region that is related to the carrier concentrations of the higher doped layers.

Depletion Width N-type Material of Main Junction  Equation 29

$$W_{dep} = \sqrt{\frac{2\varepsilon\Phi_{bi}}{qN_d}} =$$

$$\sqrt{\frac{2(80)(8.850e^{-14}\frac{f}{\text{cm}})(.1320 \text{ eV})}{(1.60e^{19}Coul)(1.0e^{19}\text{cm}^{-3})}} (10e^6) = 1.08 \text{ μm}$$

Depletion Width P-type Material of Main Junction  Equation 30

$$W_{dep} = \sqrt{\frac{2\varepsilon\Phi_{bi}}{qN_a}} =$$

$$\sqrt{\frac{2(80)(8.850e^{-14}\frac{f}{\text{cm}})(.1320 \text{ eV})}{(1.60e^{19}Coul)(1.0e^{19} \text{ cm}^{-3})}} (10e^6) = 1.08 \text{ μm}$$

The built-in potential of the junction is also called the barrier height of the junction. The value calculated here use the lower dopant concentrations of both the n-type and p-type layers. This gives the lowest value of the barrier height. The barrier height needs to be sufficient to stop a large current from being generated across the space charge region.

Built-in potential  Equation 31

$$\phi = \frac{kT}{q}\ln\left[\frac{(N_A)(N_D)}{(n_i)^2}\right] = \frac{\left(.0000861\frac{\text{eV}}{\text{K}}\right)(298 \text{ k})}{(1.60e^{19}Coul)}$$

$$\ln\left[\frac{((2.0e^{18} \text{ cm}^{-3})(2.0e^{18} \text{ cm}^{-3}))}{(7.686 \text{ cm}^{-3})^2}\right] = .0492 \text{ eV}$$

The open circuit voltage is established due to excess charge carriers being separated across the space charge region. This voltage acts similar to a forward bias in the junction. The intent is not to create a current across the junction but to have carriers flow through a circuit and generate power. The magnitude of the quasi fermi level is approximately the open circuit voltage value. Using the quasi fermi level values for the fermi level values in the conduction and valance band energy equations, new band energies can be calculated. Δn is the difference in hole concentration between the second n-type layer 12 and the first n-type layer 9, plus the difference in electron concentrations between the first p-type layer 15 and the second p-type layer 18.

Open Circuit Voltage  Equation 32

$$V_{OC} = \frac{kT}{q}\ln\left[\frac{((N_A)+(\Delta n))(\Delta n)}{(n_i)^2}\right] = \frac{\left(.0000861\frac{\text{eV}}{\text{K}}\right)(298 \text{ k})}{(1.60e^{19}Coul)}$$

$$\ln\left[\frac{((1.0e^{19} \text{ cm}^{-3}) + (4.05e^{17} \text{ cm}^{-3}))*}{(4.05e^{17} \text{ cm}^{-3})}\right] = .0128 \text{ eV}$$

The diffusion length are found based on the diffusion coefficients for electrons and holes $D_n$ and $D_p$, respectfully. As the lifetime decreases, the device thickness will decrease and still be able to harness a significant number of particles. This can be advantageous by using less materials as well as generating more power.

Diffusion Length N-Type  Equation 33

$$L_n = \sqrt{D_p\tau} = \sqrt{.003086\frac{\text{m}^2}{\text{s}}*.000001 \text{ s}} = .000056 \text{ m}$$

Diffusion Length P-Type  Equation 34

$$L_n = \sqrt{D_n\tau} = \sqrt{.001311\frac{\text{m}^2}{\text{s}}*.000001 \text{ s}} = .000036 \text{ m}$$

The current can be found two different ways. The diffusion current can be used as an ideal current value. dp and dn are the minority carrier concentration gradients. dp is the difference of minority carriers between the first n-type semiconductor layer and second n-type semiconductor layer. dp is the difference of minority carriers between the first p-type semiconductor layer and second p-type semiconductor layer. Minority carriers in the n-type material are holes and minority carriers in the p-type material are electrons. Ideal short circuit current can also be found using the diffusion length and generation rate and is also shown below. $L_n$ is the diffusion length in the n-type semiconductor and $L_p$ is the diffusion length in the p-type semiconductor material.

Diffusion Current  Equation 35

$$J_n + J_p = qD_p\frac{dp}{dx} + qD_n\frac{dn}{dx} =$$

$$(1.60e^{19}Coul)\left(30.86\frac{\text{cm}^2}{\text{s}}\right)*\left(\frac{2.03e^{17} \text{ cm}^{-3}}{5.55e^{-3} \text{ cm}}\right) +$$

$$(1.60e^{19}Coul)\left(13.11\frac{\text{cm}^2}{\text{s}}\right)*\left(\frac{2.03e^{17} \text{ cm}^{-3}}{3.62e^{-3} \text{ cm}}\right) =$$

$$297.35\frac{\text{A}}{\text{cm}^2} = 2,973,500\frac{\text{A}}{\text{m}^2}$$

Ideal short circuit current can also be found using the diffusion length and generation rate and is also shown below. $L_n$ is the diffusion length in the n-type semiconductor and $L_p$ is the diffusion length in the p-type semiconductor material.

Diffusion Current                               Equation 36

$$J_{SC} = qG(L_n + L_p) = (1.60e^{-19} Coul)\left(\frac{2.901e^{23} \text{m}^{-3}}{.000001 \text{ s}}\right)$$

$$(.000056 \text{ m} + .000036 \text{ m}) = 2,970,000 \frac{A}{\text{m}^2}$$

Ideal power is found by multiplying the short circuit current with the open circuit voltage. The minimum change in temperature in the cell needed to transfer the energy can be calculated using the heat transfer equation.

Power Equation                                  Equation 37

$$P = V * I = .01286 \text{ V} * 2,970,000 \text{ A} = 38.234 \text{ kW}$$

Conduction Heat Transfer Equation               Equation 38

$$q = kA \frac{dT}{s} = \left(3 \frac{w}{\text{mK}}\right)(1 \text{ m}^2) \frac{1.17K}{92e^6 \text{ m}} = 38.250 \text{ kw}$$

While particular embodiments, materials, parameters, values, dimensions, etc. have been described and illustrated to exemplify and teach the principles of the invention, such are not intended to be limited. Modifications of the present invention will become obvious to those skilled in the art, in light of the detailed description described above and contents contained herein, and such modifications and variations are intended to fall within the scope of the appended claims.

What is claimed is:

1. A cell comprising:
   a first substrate with a first substrate first side and a first substrate second side, wherein the first substrate is electrically insulating and thermally conductive;
   a first electrical contact with a first electrical contact first side and a first electrical contact second side, wherein the first electrical contact first side is connected to the first substrate second side;
   a first n-type semiconductor layer with a first n-type dopant concentration and a first n-type semiconductor layer first side and a first n-type semiconductor layer second side, wherein the first n-type semiconductor layer first side is connected to the first electrical contact second side;
   a second n-type semiconductor layer with a second n-type dopant concentration and a second n-type semiconductor layer first side and a second n-type semiconductor layer second side, wherein the second n-type dopant concentration is higher than the first n-type dopant concentration and the second n-type semiconductor layer first side is electrically and directly physically connected to the first n-type semiconductor layer second side;
   a first p-type semiconductor layer with a first p-type dopant concentration and a first p-type semiconductor layer first side and a first p-type semiconductor layer second side, wherein the first p-type semiconductor layer first side is connected to the second n-type semiconductor layer second side;
   a second p-type semiconductor layer with a second p-type dopant concentration and a second p-type semiconductor layer first side and a second p-type semiconductor layer second side, wherein the first p-type dopant concentration is higher than the second p-type dopant concentration and the second p-type semiconductor layer first side is electrically and directly physically connected to the first p-type semiconductor layer second side;
   a second electrical contact with a second electrical contact first side and a second electrical contact second side, wherein the second electrical contact first side is connected to the second p-type semiconductor layer second side;
   a second substrate with a second substrate first side and a second substrate second side, wherein the second substrate is electrically insulating and thermally conductive and the second substrate first side is connected to the second electrical contact second side.

2. The cell of claim 1, further comprising a first heat exchanger connected to the first substrate first side.

3. The cell of claim 1, wherein the first heat exchanger is a gas, a fluid, a heat sink or a plate type heat exchanger.

4. The cell of claim 2: further comprising a second heat exchanger connected to the second substrate second side.

5. The cell of claim 4, wherein the second heat exchanger is a gas, a fluid, a heat sink or a plate type heat exchanger.

6. The cell of claim 1, wherein the first substrate is a ceramic substrate.

7. The cell of claim 6, wherein the ceramic substrate is Aluminum Nitride (AlN), Aluminum Oxide (Al2O3) or beryllium oxide (BeO).

8. The cell of claim 1, wherein the second substrate is a ceramic substrate.

9. The cell of claim 8, wherein the ceramic substrate is Aluminum Nitride (AlN), Aluminum Oxide (Al2O3) or beryllium oxide (BeO).

10. The cell of claim 1, wherein the first n-type semiconductor layer is MgSn, MgPb, MgBi, FeSi, CoO, NiS, Sn, PbS, BiTe, PbTe, BiSe, CrO, SnTe, HgCdTe, PbSe, InAs or InSb.

11. The cell of claim 1, wherein the second n-type semiconductor layer is MgSn, MgPb, MgBi, FeSi, CoO, NiS, Sn, PbS, BiTe, PbTe, BiSe, CrO, SnTe, HgCdTe, PbSe, InAs or InSb.

12. The cell of claim 1, wherein the first p-type semiconductor layer is MgSn, MgPb, MgBi, FeSi, CoO, NiS, Sn, PbS, BiTe, PbTe, BiSe, CrO, SnTe, HgCdTe, PbSe, InAs or InSb.

13. The cell of claim 1, wherein the second p-type semiconductor layer is MgSn, MgPb, MgBi, FeSi, CoO, NiS, Sn, PbS, BiTe, PbTe, BiSe, CrO, SnTe, HgCdTe, PbSe, InAs or InSb.

14. The cell of claim 1, wherein the first n-type dopant concentration at the first n-type semiconductor layer first side is greater than the first n-type dopant concentration at the first n-type semiconductor second side.

15. The cell of claim 1, wherein the second p-type dopant concentration at the second p-type semiconductor layer second side is greater than the second p-type dopant concentration at the second p-type semiconductor first side.

16. The cell of claim 1, wherein the connection between the first electrical contact second side and the first n-type semiconductor layer first side is an ohmic contact.

17. The cell of claim 1, wherein the connection between the second electrical contact first side and the second p-type semiconductor layer second side is an ohmic contact.

18. The cell of claim 1, further comprising a first n-type material diffusion length, wherein the distance between the first side of the first n-type material and the second side of the second n-type material is between one atom thick and 110 percent of the first n-type material diffusion length.

19. The cell of claim 1, further comprising a second p-type material diffusion length, wherein the distance between the first side of the first p-type material and the second side of the second p-type material is between one atom thick and 110 percent of the second p-type material diffusion length.

20. The cell of claim 1, wherein the difference in the first n-type dopant concentration and second n-type dopant concentration results in a minority carrier concentration gradient when the cell is in thermal equilibrium.

21. The cell of claim 1, wherein the difference in the first p-type dopant concentration and second p-type dopant concentration results in a minority carrier concentration gradient when the cell is in thermal equilibrium.

* * * * *